(12) United States Patent
Kim

(10) Patent No.: US 12,120,866 B2
(45) Date of Patent: Oct. 15, 2024

(54) SEMICONDUCTOR DEVICE AND METHOD FOR FABRICATING THE SAME

(71) Applicant: SK hynix Inc., Gyeonggi-do (KR)

(72) Inventor: Jun Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 218 days.

(21) Appl. No.: 17/731,431

(22) Filed: Apr. 28, 2022

(65) Prior Publication Data

US 2023/0125896 A1 Apr. 27, 2023

(30) Foreign Application Priority Data

Oct. 22, 2021 (KR) .......................... 10-2021-0141803

(51) Int. Cl.
*H01L 29/66* (2006.01)
*H01L 29/51* (2006.01)
*H01L 29/78* (2006.01)
*H10B 12/00* (2023.01)

(52) U.S. Cl.
CPC .......... *H10B 12/30* (2023.02); *H01L 29/516* (2013.01); *H01L 29/6684* (2013.01); *H01L 29/78391* (2014.09); *H10B 12/03* (2023.02); *H10B 12/05* (2023.02)

(58) Field of Classification Search
CPC ........ H10B 12/30; H10B 12/03; H10B 12/05; H10B 53/20; H10B 53/30; H10B 12/488; H01L 29/516; H01L 29/6684; H01L 29/78391; H01L 29/66969; H01L 29/7869
USPC ......................................... 257/296
See application file for complete search history.

(56) References Cited

U.S. PATENT DOCUMENTS

| 8,729,617 B2* | 5/2014 | Kim ..................... H10B 12/053 438/137 |
| 10,535,659 B2 | 1/2020 | Kim et al. |
| 2013/0161710 A1* | 6/2013 | Ji .......................... H10B 12/31 257/296 |
| 2013/0285199 A1* | 10/2013 | Nagai ................. H01L 27/0203 257/532 |
| 2013/0334582 A1* | 12/2013 | Mizuguchi ............ H10B 12/30 257/296 |

(Continued)

OTHER PUBLICATIONS

Koji Kita et al., Origin of electric dipoles formed at high-k/SiO2 interface, Applied Physics Letters, 2009, vol. 94, issue 132902, AIP Publishing.

*Primary Examiner* — Sheikh Maruf
(74) *Attorney, Agent, or Firm* — IP & T GROUP LLP

(57) ABSTRACT

Present invention relates to a highly-integrated memory cell and a semiconductor device including the same. According to an embodiment of the present invention, a semiconductor device comprises: an active layer including a channel, the active layer being spaced apart from a substrate and extending in a direction parallel to a surface of the substrate; a gate dielectric layer formed over the active layer; a word line laterally oriented in a direction crossing the active layer over the gate dielectric layer and including a low work function electrode and a high work function electrode, the high work function electrode having a higher work function than the low work function electrode; and a dipole inducing layer disposed between the high work function electrode and the gate dielectric layer.

15 Claims, 17 Drawing Sheets

(56) References Cited

U.S. PATENT DOCUMENTS

| | | | |
|---|---|---|---|
| 2014/0048860 A1* | 2/2014 | Mikasa | H10B 12/053 |
| | | | 257/296 |
| 2014/0061743 A1* | 3/2014 | Kim | H10B 12/053 |
| | | | 257/296 |
| 2014/0159131 A1* | 6/2014 | Jin | H10B 12/485 |
| | | | 257/296 |
| 2014/0227854 A1* | 8/2014 | Ozaki | H01L 28/40 |
| | | | 438/399 |
| 2014/0361233 A1* | 12/2014 | Kim | H01L 29/161 |
| | | | 438/238 |
| 2015/0069482 A1* | 3/2015 | Mueller | H01L 27/0207 |
| | | | 257/334 |
| 2016/0099248 A1* | 4/2016 | Wu | H10B 12/053 |
| | | | 257/296 |
| 2016/0155744 A1* | 6/2016 | Rhie | H10B 12/0335 |
| | | | 257/296 |
| 2021/0057419 A1 | 2/2021 | Shin et al. | |
| 2021/0375990 A1* | 12/2021 | Young | H01L 29/78642 |

* cited by examiner

SEMICONDUCTOR DEVICE AND METHOD FOR FABRICATING THE SAME

CROSS-REFERENCE TO RELATED APPLICATIONS

The present application claims priority to Korean Patent Application No. 10-2021-0141803, filed on Oct. 22, 2021, which is incorporated herein by reference in its entirety.

BACKGROUND

1. Field

The present invention relates to a semiconductor device, and more particularly, to a semiconductor device including a three-dimensional memory cell and a method of fabricating the same.

2. Description of the Related Art

Integration degree of two-dimensional semiconductor memory devices is mainly determined by the area occupied by memory cells. Thus, the integration degree is hugely affected by the level of a fine-pattern fabrication technology. The integration degree of two-dimensional semiconductor memory devices is still increasing, but the increase is limited because fabricating finer patterns requires highly expensive tools. Accordingly, three-dimensional (3D) semiconductor memory devices having three-dimensionally arranged memory cells are being suggested.

SUMMARY

Embodiments of the present invention disclosure provide a 3D highly integrated memory cell and a 3D semiconductor memory device including the highly integrated memory cells.

According to an embodiment of the present invention, a semiconductor device comprises: an active layer including a channel, the active layer being spaced apart from a substrate and extending in a direction parallel to a surface of the substrate; a gate dielectric layer formed over the active layer; a word line laterally oriented in a direction crossing the active layer over the gate dielectric layer and including a low work function electrode and a high work function electrode, the high work function electrode having a higher work function than the low work function electrode; and a dipole inducing layer disposed between the high work function electrode and the gate dielectric layer.

According to an embodiment of the present invention, a method of fabricating a semiconductor device, the method comprises: forming an active layer on a substrate, the active layer being vertically spaced apart from the substrate; forming a gate dielectric layer over the active layer; forming a low work function electrode over the gate dielectric layer; forming a dipole inducing layer on a side of the low work function electrode and over the gate dielectric layer; and forming a high work function electrode over the dipole inducing layer, the high work function electrode having a higher work function than the low work function electrode.

According to an embodiment of the present invention, a method of fabricating a semiconductor device, the method comprises: forming a stack body in which a first interlayer dielectric layer, a first sacrificial layer, an active layer, a second sacrificial layer, and a second interlayer dielectric layer are sequentially stacked; forming a first opening penetrating through the stack body; forming recesses by removing the first sacrificial layer and second sacrificial layer through the first opening; forming a gate dielectric layer over the active layer exposed by the recesses; forming a low work function electrode partially filling the recesses over the gate dielectric layer; forming a dipole inducing layer on a side of the low work function electrode and over the gate dielectric; and forming a high work function electrode filling a remainder of the recesses over the dipole inducing layer and having a higher work function than the low work function electrode.

According to an embodiment of the present invention, a semiconductor device may include an active layer spaced apart from a substrate wherein the active layer extends in a direction parallel to the substrate and includes a channel; a bit line extending in a direction perpendicular to the substrate and coupled to a first end of the active layer; a capacitor coupled to a second end of the active layer; and a word line structure extending in a direction crossing the active layer, wherein the word line structure may include a high work function electrode which is adjacent to the bit line; a low work function electrode which is adjacent to the capacitor and having a lower work function than the high work function electrode; and a dipole inducing layer disposed between the high work function electrode and the low work function electrode.

The present invention can increase the cell threshold voltage using a flat-band shift by forming a dipole inducing layer between the high work function electrode and the gate dielectric layer.

As the word line has a dual work function electrode of a low work function electrode and a high work function electrode, the present invention can realize low power consumption while securing the refresh characteristics of the memory cell.

DETAILED DESCRIPTION

Figure 1:
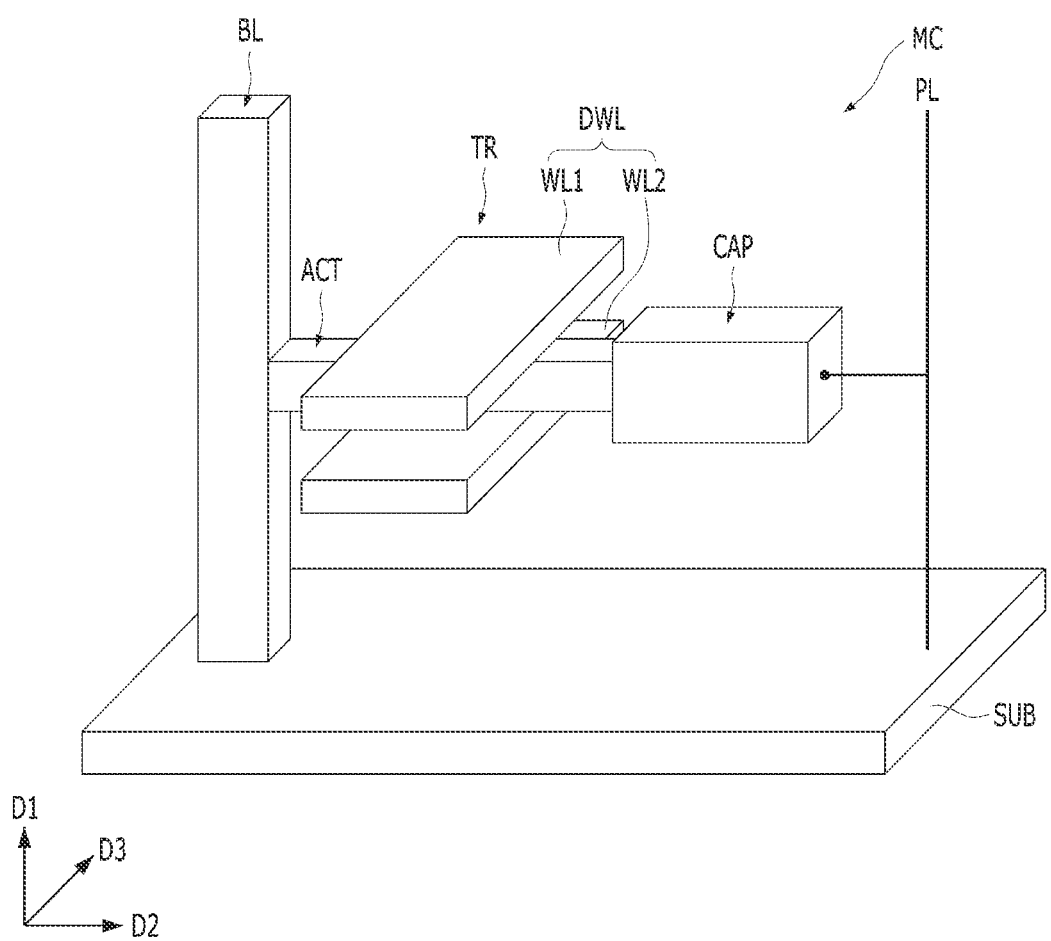
FIG. 1 shows a schematic perspective view of a memory cell according to an embodiment of the present invention.

Various embodiments described herein will be described with reference to cross-sectional views, plane views and block diagrams, which are ideal schematic views of the present invention. Therefore, the structures of the drawings may be modified by fabricating invention and/or tolerances. Various embodiments of the present invention are not limited to the specific structures shown in the drawings, but include any changes in the structures that may be produced according to the fabricating process. Also, any regions and shapes of regions illustrated in the drawings have schematic views, are intended to illustrate specific examples of structures of regions of the various elements, and are not intended to limit the scope of the invention.

Embodiments of the present invention may vertically stack memory cells to increase memory cell density and reduce parasitic capacitance.

A cell threshold voltage (CVT) depends on a flat-band voltage. The flat-band voltage depends on the work function. The work function may be engineered by various methods. For example, the work function may be controlled by a material of the gate electrode, a material between the gate electrode and the channel, a dipole, and the like. The flat-band voltage may be shifted by increasing or decreasing the work function. The high work function may shift the flat-band voltage in a positive direction, and the low work function may shift the flat-band voltage in a negative direction. As described above, the cell threshold voltage can be adjusted by shifting the flat-band voltage. In embodiments, the threshold voltage may be adjusted by a flat-band voltage shift even if the channel concentration is reduced or channel doping is omitted. For example, the flat-band voltage may be shifted by the dipole inducing layer.

Embodiments relate to a three-dimensional DRAM, wherein a word line may include a low work function electrode and a high work function electrode. The low work function electrode may be adjacent to the capacitor, and the high work function electrode may be adjacent to the bit line. The low work function electrode may include polysilicon, and the high work function electrode may include a metal-based material.

Due to the low work function of the low work function electrode, a low electric field is formed between the word line and the capacitor, thereby improving leakage current.

The high work function of the high work function electrode can control the threshold voltage and lower the height of the memory cell by forming a low electric field, which is advantageous for improving integration degree.

Figure 2:
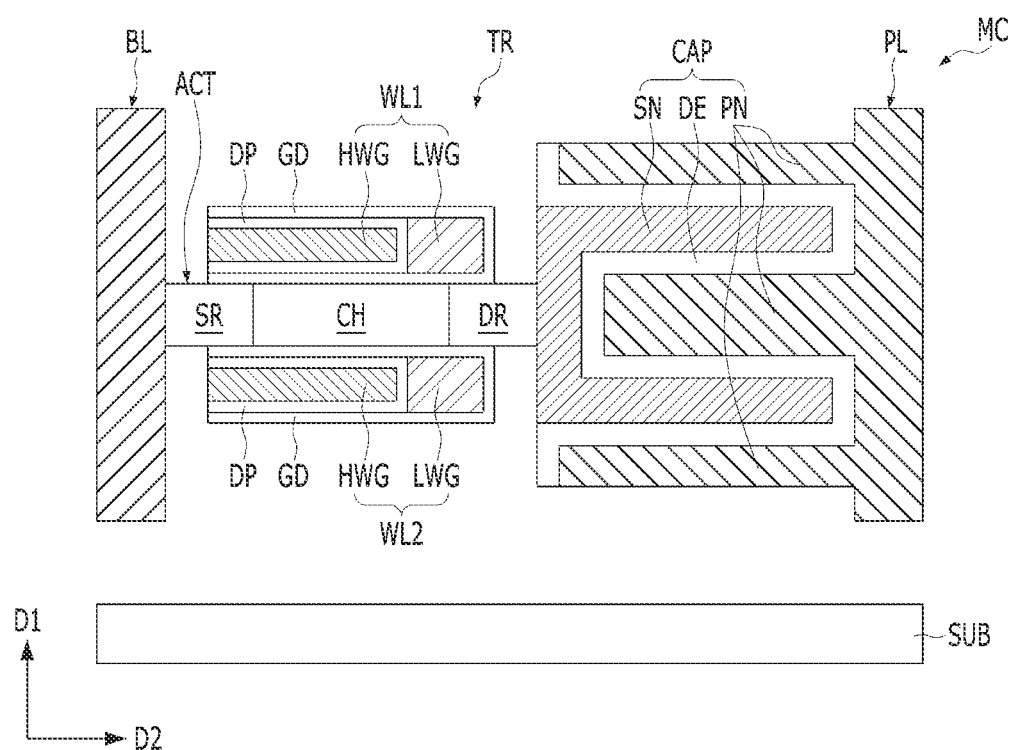
FIG. 2 shows a cross-sectional view of the memory cell of FIG. 1.

FIG. 1 shows a schematic perspective view of a memory cell according to an embodiment of the present invention. FIG. 2 shows a cross-sectional view of the memory cell of FIG. 1.

Referring to FIGS. 1 and 2, a memory cell MC may include a bit line BL, a transistor TR, and a capacitor CAP. The transistor TR may include an active layer ACT, a gate dielectric layer GD, and a double word line DWL. The capacitor CAP may include a storage node SN, a dielectric layer DE, and a plate node PN.

The bit line BL may have a pillar shape extending along the first direction D1 perpendicular to the surface of the substrate SUB. The active layer ACT may have a bar shape extending along the second direction D2 intersecting the first direction D1. The double word line DWL may have a line shape extending along the third direction D3 intersecting the first and second directions D1 and D2. The plate node PN of the capacitor CAP may be connected to a plate line PL.

The bit line BL may be vertically oriented along the first direction D1. The bit line BL may be referred to as a vertically oriented bit line or a pillar type bit line. The bit line BL may include a conductive material. The bit line BL may include a silicon-based material, a metal-based material, or a combination thereof. The bit line BL may include polysilicon, metal, metal nitride, metal silicide, or a combination thereof. The bit line BL may include polysilicon, titanium nitride, tungsten, or a combination thereof. For example, the bit line BL may include polysilicon or titanium nitride (TiN) doped with an N-type impurity. The bit line BL may include a stack of titanium nitride and tungsten (TiN/W).

The double word line DWL may extend along the third direction D3. The active layer ACT may extend along the second direction D2. The active layer ACT may be laterally arranged along the second direction D2 from the bit line BL. The double word line DWL may include a first word line WL1 and a second word line WL2. The first word line WL1 and the second word line WL2 may face each other with the active layer ACT interposed therebetween. The gate dielectric layer GD may be formed on an upper surface and a lower surface of the active layer ACT, respectively.

The active layer ACT may be spaced apart from the substrate SUB and extend in a second direction D2 parallel to the surface (e.g., a top surface of the substrate) of the substrate SUB. The active layer ACT may include a semiconductor material. For example, the active layer ACT may include polysilicon, monocrystalline silicon, germanium, or silicon-germanium. The active layer ACT may include a channel CH, a first source/drain region SR between the channel CH and the bit line BL, and a second source/drain region DR between the channel CH and the capacitor CAP. In another embodiment, the active layer ACT may include an oxide semiconductor material. For example, the oxide semiconductor material may include Indium Gallium Zinc Oxide (IGZO). When the active layer ACT is made of an oxide semiconductor material, the channel CH may be made of an oxide semiconductor material, and the first and second source/drain regions SR and DR may be omitted.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include arsenic (As), phosphorus (P), boron (B), Indium (In), and at least one impurity selected from a combination thereof. A first side of the first source/drain region SR may contact the bit line BL, and a second side of the first source/drain region SR may contact the channel CH. A first side of the second source/drain region DR may contact the storage node SN, and a second side of the second source/drain region DR may contact the channel CH. The second side of the first source/drain region SR and the second side of the second source/drain region DR may partially overlap side of the first and second word lines WL1 and WL2, respectively.

The transistor TR is a cell transistor and may include the double word line DWL as described above. In the double word line DWL, the first word line WL1 and the second word line WL2 may have the same potential. For example, the first word line WL1 and the second word line WL2 may form a pair to be coupled to one memory cell MC. The same word line driving voltage may be applied to the first word line WL1 and the second word line WL2. As such, in the memory cell MC according to the present embodiment, a double word line DWL may have two word lines, which are the first and second word lines WL1 and WL2, disposed adjacent to one channel CH.

The active layer ACT may have a thickness smaller than that of the first and second word lines WL1 and WL2. In other words, a vertical thickness of the active layer ACT in the first direction D1 may be smaller than each vertical thickness of the first and second word lines WL1 and WL2 in the first direction D1.

As such, the thin active layer ACT may be referred to as a thin-body active layer. The thin active layer ACT may include a thin channel CH. The thin channel CH may be referred to as a 'thin-body channel (CH).' In another embodiment, the channel CH may have the same thickness as the first and second word lines WL1 and WL2.

An upper surface and a lower surface of the active layer ACT may be flat. The upper and lower surfaces of the active layer ACT may be parallel to each other along the second direction D2.

A gate dielectric layer GD may be disposed between the first word line WL1 and the active layer ACT. A gate dielectric layer GD may be disposed between the second word line WL2 and the active layer ACT. The gate dielectric layer GD may include silicon oxide, silicon nitride, a high-k material, a ferroelectric material, an anti-ferroelectric material, or a combination thereof.

The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of less than 4.5 eV. The P-type work function material may have a high work function of greater than 4.5 eV.

In this embodiment, the double word line DWL may include a pair of the first and second word lines WL1 and WL2 with the active layer ACT interposed therebetween. The double word line DWL may be coupled to one memory cell MC.

Each of the first and second word lines WL1 and WL2 may include a dual work function electrode. The dual work function electrode may be laterally oriented along the second direction D2 to face the active layer ACT on the gate dielectric layer GD. The dual work function electrode may include a high work function electrode HWG and a low work function electrode LWG. The high work function electrode HWG and the low work function electrode LWG may be disposed to be laterally adjacent to each other in the second direction D2. The low work function electrode LWG may be disposed adjacent to the second source/drain region DR, and the high work function electrode HWG may be disposed adjacent to the first source/drain region SR.

The low work function electrode LWG and the high work function electrode HWG are formed of different work function materials. The high work function electrode HWG may have a higher work function than the low work function electrode LWG. The high work function electrode HWG may include a high work function material. The high work function electrode HWG may have a higher work function than a mid-gap work function of silicon. The mid-gap work function of silicon may be about 4.5 eV. The low work function electrode LWG may include a low work function material. The low work function electrode LWG is a material having a work function lower than the mid-gap work function of silicon. In other words, the high work function electrode HWG may have a work function higher than 4.5 eV, and the low work function electrode LWG may have a work function lower than 4.5 eV. The low work function electrode LWG may include polysilicon doped with N-type impurities. The high work function electrode HWG may include a metal-based material. The high work function electrode HWG may include tungsten, titanium nitride, or a combination thereof. A conductive barrier layer may be further formed between the low work function electrode LWG and the high work function electrode HWG, wherein the high work function electrode HWG may include tungsten, and the conductive barrier layer may include titanium nitride.

A width of the high work function electrode HWG in the second direction D2 may be greater than a width of the low work function electrode LWG in the second direction D2. A thickness of the low work function electrode LWG in the first direction D1 may be greater than a thickness of the high work function electrode HWG in the first direction D1. The high work function electrode HWG may have a larger volume than the low work function electrode LWG, and accordingly, the first and second word lines WL1 and WL2 may have low resistivity.

The high work function electrode HWG and the low work function electrode LWG may vertically overlap the active layer ACT along the first direction D1. An overlapping area between the high work function electrode HWG and the active layer ACT may be greater than an overlapping area between the low work function electrode LWG and the active layer ACT. For example, the high work function electrode HWG and the active layer ACT may vertically overlap in the first direction D1. The high work function electrode HWG and the first source/drain region SR may vertically overlap in the first direction D1. The high work function electrode HWG and the channel CH may vertically overlap in the first direction D1. The low work function electrode LWG and the active layer ACT may vertically overlap in the first direction D1. The low work function electrode LWG and the second source/drain region DR may vertically overlap in the first direction D1. The low work function electrode LWG and the channel CH may vertically overlap in the first direction D1. An overlapping area between the high work function electrode HWG and the channel CH may be greater than an overlapping area between the low work function electrode LWG and the second source/drain region DR. An overlapping area between the high work function electrode HWG and the channel CH may be greater than an overlapping area between the low work function electrode LWG and the channel CH. The low work function electrode LWG and the high work function electrode HWG may extend in parallel along the third direction D3, and the low work function electrode LWG and the high work function electrode HWG may not directly contact each other.

A dipole inducing layer DP may be disposed between the low work function electrode LWG and the high work function electrode HWG. The dipole inducing layer DP may cover the upper and lower surfaces of the high work function electrode HWG and may extend to be disposed between the low work function electrode LWG and the high work function electrode HWG.

The dipole inducing layer DP may cover the high work function electrode HWG, and the gate dielectric layer GD may cover the dipole inducing layer DP and the low work function electrode LGW. A low work function electrode LWG may be disposed between the gate dielectric layer GD and the dipole inducing layer DP. The gate dielectric layer GD and the dipole inducing layer DP may each have a '⊐' shape. The high work function electrode HWG may include an exposed side facing the bit line BL. The exposed side of the high work function electrode HWG may not be covered by the gate dielectric layer GD or the dipole inducing layer DP. The gate dielectric layer GD may be disposed between the dipole inducing layer DP and the active layer ACT. The high work function electrode HWG and the low work function electrode LWG may be parallel to each other with the dipole inducing layer DP interposed therebetween.

The dipole inducing layer DP may be disposed between the high work function electrode HWG and the gate dielectric layer GD. The effective work function of the high work function electrode HWG may be increased by the dipole inducing layer DP. For example, when the dipole inducing layer DP and the gate dielectric layer GD contact each other, a dipole may be generated. When a dipole is generated, a high work function characteristic may be induced due to a change in an energy band. That is, the high work function electrode HWG may have an increased work function due to the dipole. The dipole inducing layer DP may be referred to as a 'high work function control liner.' The dipole inducing layer DP may be an insulating material. The dipole inducing layer DP may be a metal oxide. The dipole inducing layer DP may be a high-k material having a higher dielectric constant than the gate dielectric layer GD. The dipole inducing layer DP and the gate dielectric layer GD may have different oxygen contents. The dipole inducing layer DP may be formed of high oxygen contained-metal oxide having a higher oxygen content per unit volume than the gate dielectric layer GD. That is, the dipole inducing layer DP may include a material having a higher areal density of oxygen atoms than the gate dielectric layer GD. The dipole inducing layer DP may include aluminum oxide ($Al_2O_3$) or hafnium oxide ($HfO_2$).

When the dipole inducing layer DP overlaps the channel CH, the cell threshold voltage CVT is adjusted by the dipole inducing layer DP. For example, the flat-band voltage may be shifted by the dipole inducing layer DP. A dipole may be formed between the dipole inducing layer DP and the gate dielectric layer GD. The dipole may be generated by a difference in oxygen content between the dipole inducing layer DP and the gate dielectric layer GD. The dipole may increase the work function of the high work function electrode HWG, and accordingly shift the flat-band voltage to adjust the cell threshold voltage. As a result, the dose of the channel CH can be lowered by the dipole inducing layer DP. In the present embodiment, since the dipole inducing layer DP is a material having a higher oxygen content per unit volume than the gate dielectric layer GD, a dipole changing in a direction to a high work function may be generated.

A double gate dielectric layer structure may be disposed between the high work function electrode HWG and the active layer ACT, and a single gate dielectric layer structure may be disposed between the low work function electrode LWG and the active layer ACT. The double gate dielectric layer structure may be provided by a stack of the gate dielectric layer GD and the dipole inducing layer DP, and the single gate dielectric layer structure may be provided by the gate dielectric layer GD. The double gate dielectric layer structure may be thicker than the single gate dielectric layer structure. The double gate dielectric layer structure of the gate dielectric layer GD and the dipole inducing layer DP may be referred to as a 'channel-side gate dielectric layer' contacting the channel CH.

The dipole inducing layer DP may serve to block the out-diffusion of impurities from the low work function electrode LWG. That is, the dipole inducing layer DP may suppress the loss of impurity from the low work function electrode LWG.

Even when the dipole inducing layer DP is formed, the high work function electrode HWG and the low work function electrode LWG may be interconnected. For example, one end of the high work function electrode HWG extending along the third direction D3 and one end of the low work function electrode LWG may be interconnected.

As described above, each of the first and second word lines WL1 and WL2 may have a dual work function electrode structure including a low work function electrode LWG and a high work function electrode HWG. In other words, the double word line DWL including the first word line WL1 and the second word line WL2 may include a pair of dual work function electrodes which extends in the third direction D3 crossing the channel CH with the channel CH interposed therebetween.

The capacitor CAP may be laterally disposed along the second direction D2 from the transistor TR. The capacitor CAP may include the storage node SN laterally extending from the active layer ACT in the second direction D2. The capacitor CAP may further include a dielectric layer DE and a plate node PN formed on the storage node SN. The storage node SN, the dielectric layer DE, and the plate node PN may be laterally arranged in the second direction D2. The storage node SN may have a laterally oriented cylinder-shape. The dielectric layer DE may conformally cover the cylinder inner wall and the cylinder outer wall of the storage node SN. The plate node PN may have a shape extending to a cylinder inner wall and a cylinder outer wall of the storage node SN formed on the dielectric layer DE. The plate node PN may be connected to the plate line PL. The storage node SN may be electrically connected to the second source/drain region DR.

The storage node SN may have a three-dimensional structure, and the storage node SN of the three-dimensional structure may have a lateral three-dimensional structure oriented along the second direction D2. As an example of the three-dimensional structure, the storage node SN may have a cylinder shape. In another embodiment, the storage node SN may have a pillar shape or a pillar shape. The pillar shape may refer to a structure in which a pillar shape and a cylinder shape are merged.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), and ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the stack of titanium nitride/silicon germanium/tungsten nitride (TiN/SiGe/WN), silicon germanium may be a gap-fill material filling the inside of the cylinder of the storage node SN, and titanium nitride (TiN) may serve as the plate node PN of the capacitor CAP, and tungsten nitride may be a low-resistivity material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. High-k materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be formed of a composite layer including two or more layers of the aforementioned high-k material.

The dielectric layer DE may be formed of a zirconium-based oxide. The dielectric layer DE may have a stack structure including zirconium oxide ($ZrO_2$). The stack structure including zirconium oxide ($ZrO_2$) may include a $ZrO_2/Al_2O_3$ (ZA) stack or a $ZrO_2/Al_2O_3/ZrO_2$ (ZAZ) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. In another embodiment, the dielectric layer DE may be formed of a hafnium (Hf)-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, the band gap energy of aluminum oxide ($Al_2O_3$) may be greater than those of zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a band gap greater than that of the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high bandgap material may be thinner than the high-k material. In another embodiment, the dielectric layer DE may include a laminated structure in which a high-k material and a high-bandgap material are alternately stacked. For example, the dielectric layer DE may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structures described above, aluminum oxide ($Al_2O_3$) may be thinner than zirconium oxide and hafnium oxide.

In another embodiment, the dielectric layer DE may include a stack structure of zirconium oxide, hafnium oxide, and aluminum oxide, a laminated structure, or an intermixing structure.

In another embodiment, the dielectric layer DE may include a ferroelectric material or an anti-ferroelectric material.

In another embodiment, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with other data storage materials. For example, the data storage material may be a phase change material, a magnetic tunnel junction (MTJ), or a variable resistance material.

As described above, the memory cell MC may include a double word line DWL having a pair of dual work function electrodes. Each of the first and second word lines WL1 and WL2 of the double word line DWL may include a low work function electrode LWG and a high work function electrode HWG. The low work function electrode LWG may be adjacent to the capacitor CAP, and the high work function electrode HWG may be adjacent to the bit line BL. Due to the low work function of the low work function electrode LWG, a low electric field is formed between the double word line DWL and the capacitor CAP, thereby improving leakage current. The high work function of the high work function electrode can control the threshold voltage of the transistor TR and lower the height of the memory cell MC by forming a low electric field, which is advantageous for integration.

As Comparative Example 1, when the first and second word lines WL1 and WL2 are formed of a metal-based material alone, a high electric field is formed between the first and second word lines WL1 and WL2 and the capacitor CAP due to the high work function of the metal-based material, thereby deteriorating the leakage current of the memory cell. The deterioration of the leakage current due to such a high electric field worsens as the channel CH becomes thinner.

As Comparative Example 2, when the first and second word lines WL1 and WL2 are formed of a low work function material alone, the threshold voltage of the transistor decreases due to the low work function, thereby generating a leakage current.

In this embodiment, since each of the first and second word lines WL1 and WL2 of the double word line DWL have dual work function electrodes, the leakage current is improved. Therefore, the lower power consumption can be achieved by securing the refresh characteristic of the memory cell MC.

In the present embodiment, since each of the first and second word lines WL1 and WL2 of the double word line DWL have dual work function electrodes, decreasing the thickness of the channel CH is relatively advantageous for increasing the electric field and enables stacking many layers.

In this embodiment, the cell threshold voltage can be increased by the combination of the high work function electrode HWG and the dipole inducing layer DP without doping the channel CH. Although the cell threshold voltage can be increased when either of the high work function electrode HWG or the dipole inducing layer DP is used alone, the cell threshold voltage can be further increased when the high work function electrode HWG and the dipole inducing layer DP are used in combination.

In this embodiment, when the channel CH includes monocrystalline silicon, it is possible to prevent the cell threshold voltage from being reduced by the combination of the high work function electrode HWG and the dipole inducing layer DP.

As another embodiment, a stack of the gate dielectric layer GD and the low work function control liner may be disposed between the low work function electrode LWG and the second source/drain region DR. Here, the low work function control liner may include a dipole inducing material, and the low work function control liner may include a material having an areal density of oxygen atoms lower than that of the gate dielectric layer GD. The material having a low areal density of oxygen atom may include lanthanum oxide ($La_2O_3$) or yttrium oxide ($Y_2O_3$). When a combination of the low work function control liner and the low work function electrode (LWG) is formed, gate induced drain leakage (GIDL) can be further suppressed.

Figure 3:
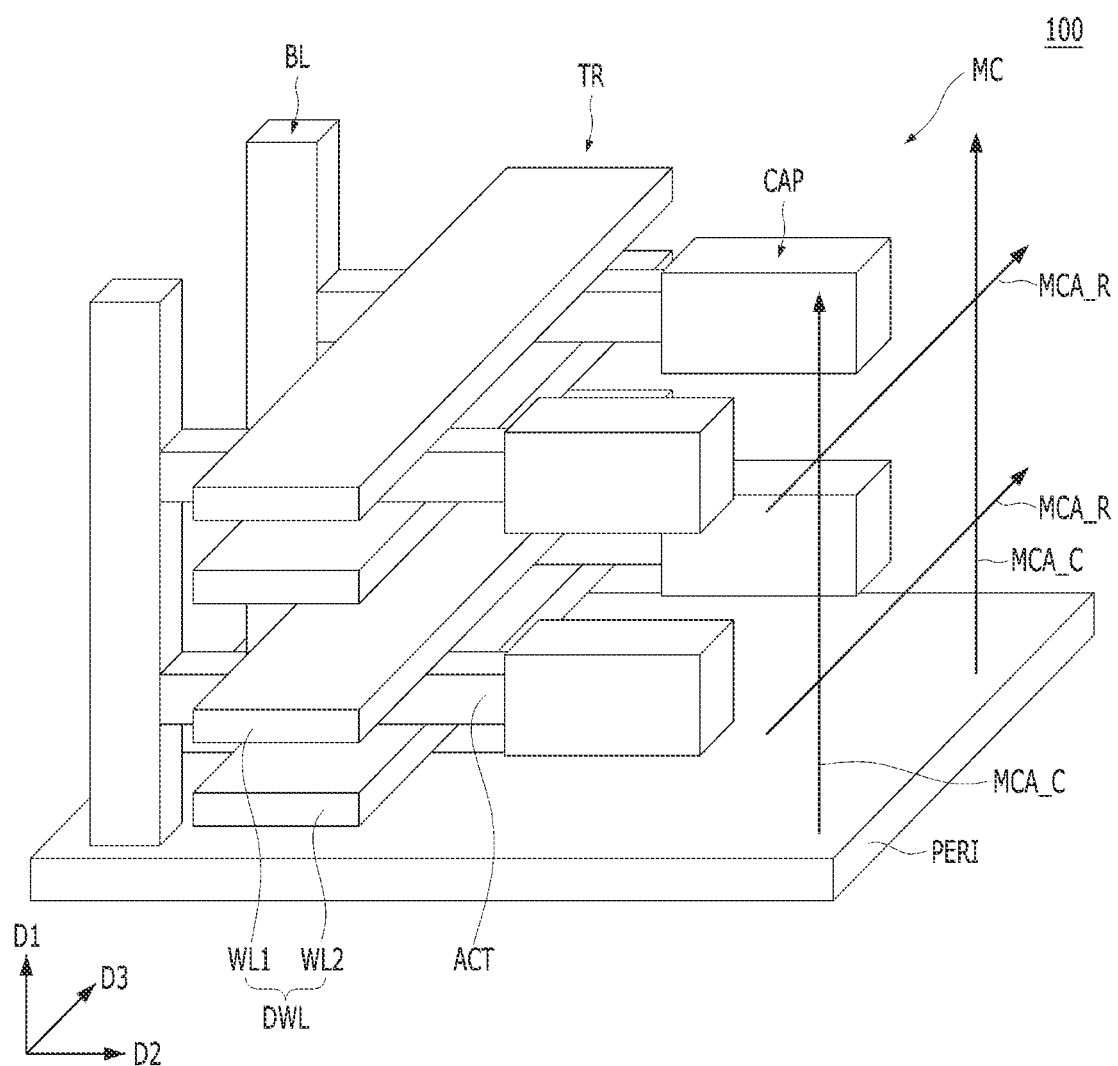
FIG. 3 is a schematic perspective view of a semiconductor memory device according to an embodiment of the present invention.
Figure 4:
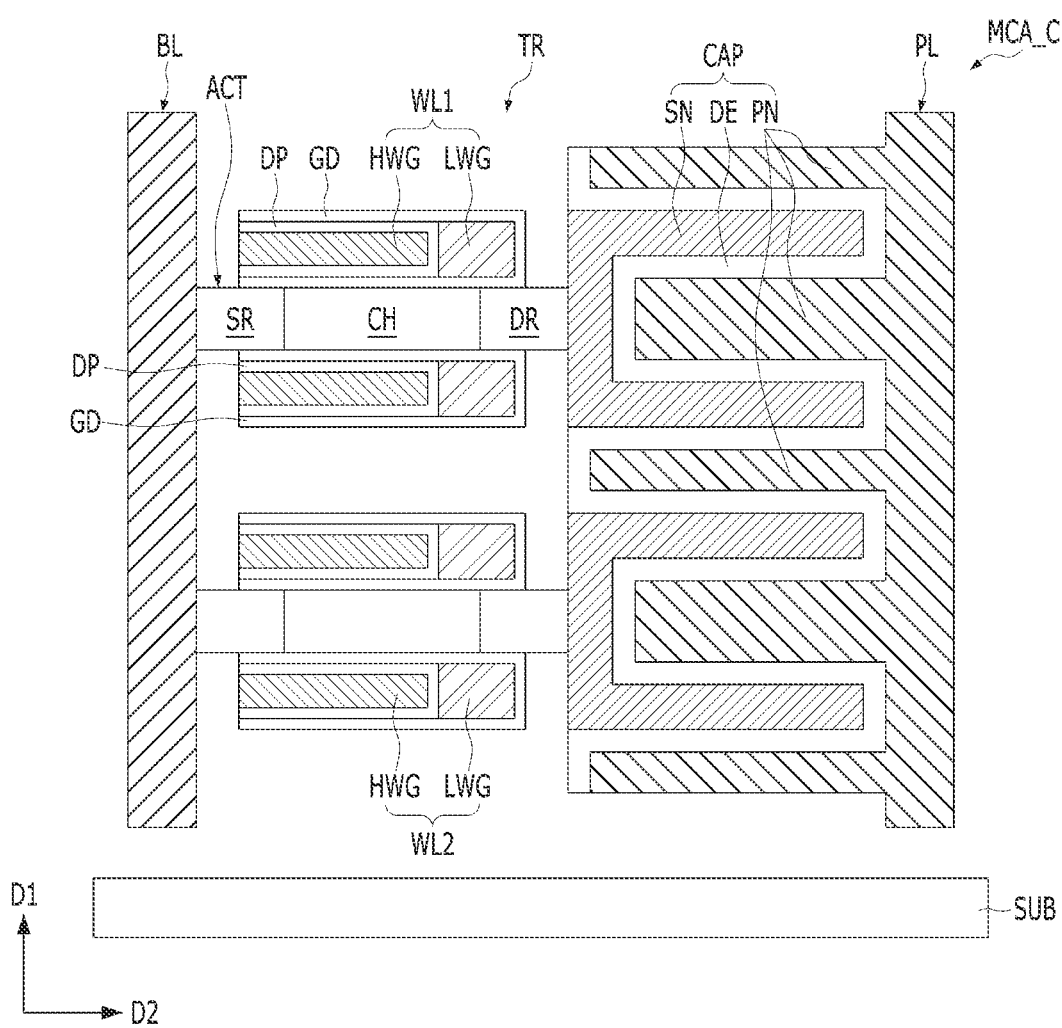
FIG. 4 is a cross-sectional view of the vertical memory cell array MCA_C of FIG. 3.
Figure 5A:
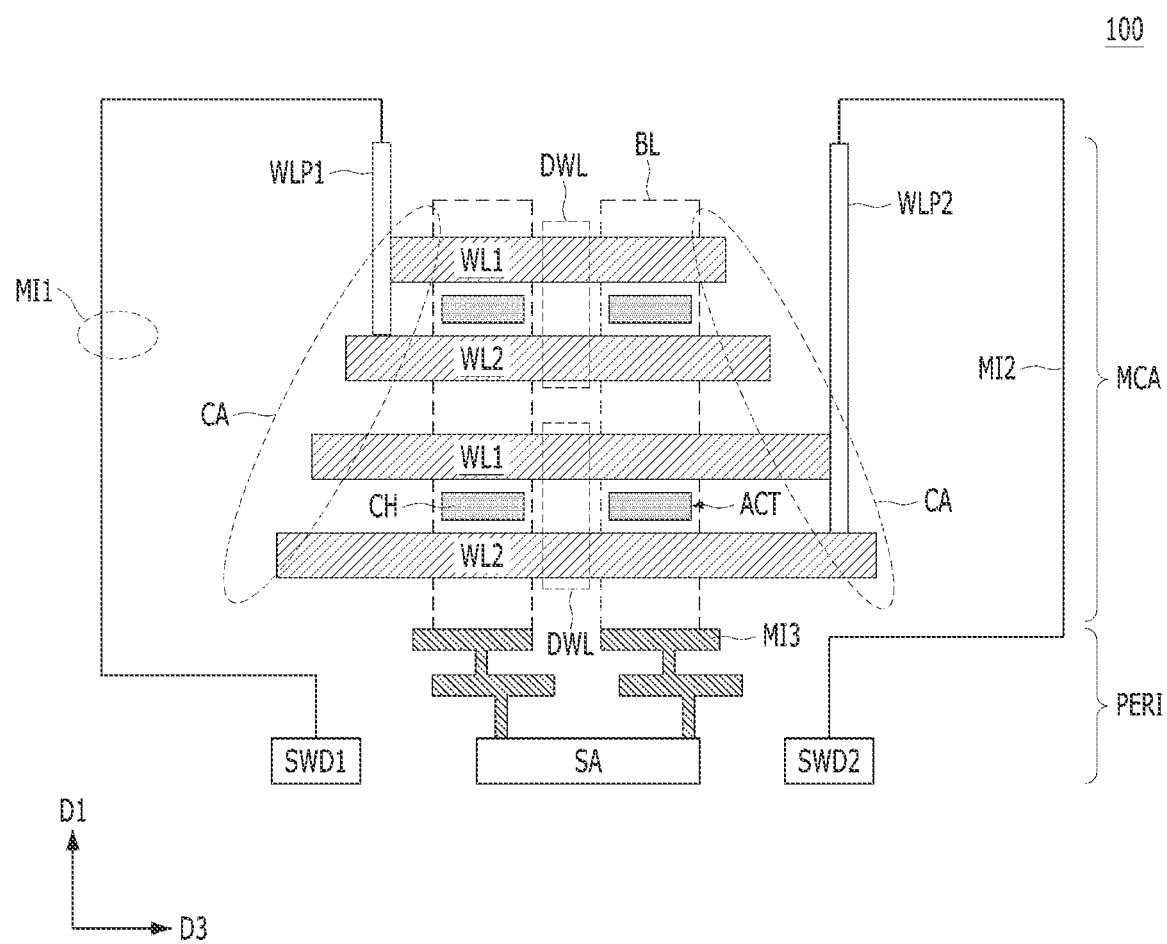
FIGS. 5A and 5B are cross-sectional views illustrating edge portions of double word lines.
Figure 5B:
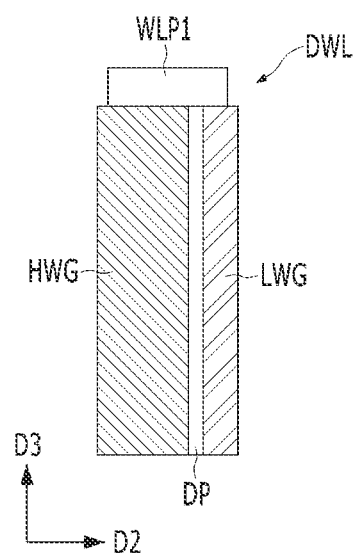

FIG. 3 is a schematic perspective view of a semiconductor memory device according to an embodiment of the present invention. FIG. 4 is a cross-sectional view of the vertical memory cell array MCA_C of FIG. 3. FIGS. 5A and 5B are cross-sectional views illustrating edge portions of double word lines.

Referring to FIGS. 3 to 5B, the semiconductor memory device 100 may include a memory cell array MCA. A plurality of memory cells MC of FIG. 1 may be arranged along the first to third directions D1, D2, and D3 to form a multi-layered memory cell array MCA. The memory cell array MCA may include a three-dimensional array of memory cells MC. The three-dimensional memory cell array may include a vertical memory cell array MCA_C and a horizontal memory cell array MCA_R. The vertical memory cell array MCA_C may refer to an array of memory cells MC vertically arranged in the first direction D1. The horizontal memory cell array MCA_R may refer to an array of memory cells MC that are laterally arranged in the third direction D3. The vertical memory cell array MCA_C may be referred to as a column array of memory cells MC, and the horizontal memory cell array MCA_R may be referred to as a row array of memory cells MC. The bit line BL may be vertically oriented to be connected to the vertical memory cell array MCA_C, and the double word line DWL may be laterally oriented to be connected to the horizontal memory cell array MCA_R. The bit line BL connected to the vertical memory cell array MCA_C may be referred to as a common bit line BL. The vertical memory cell arrays MCA_C adjacent in the third direction D3 may be connected to different common bit lines BL. The double word line DWL connected to the horizontal memory cell array MCA_R may be referred to as a common double word line DWL. The horizontal memory cell arrays MCA_R adjacent to each other along the first direction D1 may be connected to different common double word lines.

The memory cell array MCA may include a plurality of memory cells MC. Each memory cell MC may include a vertically oriented bit line BL, a laterally oriented active layer ACT, a double word line DWL, and a laterally oriented capacitor CAP. FIG. 3 illustrates a three-dimensional memory cell array including four memory cells MC.

Active layers ACT adjacent to each other in the first direction D1 may contact one bit line BL. Active layers ACT adjacent to each other along the third direction D3 may share the double word line DWL. The capacitors CAP may be connected to the respective active layers ACT. The capacitors CAP may share one plate line PL. The individual active layers ACT may be thinner than each of the first and second word lines WL1 and WL2 of the double word line DWL.

In the memory cell array MCA, two double word lines DWL may be vertically stacked in the first direction D1. Each double word line DWL may include a pair of a first word line WL1 and a second word line WL2. Between the first word line WL1 and the second word line WL2, a plurality of active layers ACT may be spaced apart from each other in the second direction D2 and arranged laterally.

Each active layer ACT may include a channel CH, a first source/drain region SR, and a second source/drain region DR. The channel CH may be disposed between the first word line WL1 and the second word line WL2. The first source/drain regions SR may be connected to one bit line BL. The individual second source/drain regions DR may be connected to the individual storage nodes SN.

Each of the first and second word lines WL1 and WL2 of the double word line DWL may include a low work function electrode LWG and a high work function electrode HWG. The low work function electrodes LWG may be disposed adjacent to the capacitor CAP. The high work function electrodes HWG may be disposed adjacent to the bit line BL.

Referring to FIG. 5A, both edge portions of each of the double word lines DWL may have a step shape, and the step shape may define the contact portions CA. Each of the first word lines WL1 and the second word lines WL2 may include edge portions at both sides, that is, the contact portions CA. Each of the contact portions CA may have a step shape.

A plurality of word line pads WLP1 and WLP2 may be respectively connected to the contact portions CA. The first word line pad WLP1 may be connected to the upper-level double word line DWL, for example, the contact portions CA of the upper-level first word line WL1 and the second word line WL2. The second word line pad WLP2 may be connected to the lower-level double word line DWL, for example, the contact portions CA of the lower-level first word line WL1 and the second word lines WL2. The upper-level first word line WL1 and the upper-level second word line WL2 may be interconnected by the first word line pad WLP1. The lower-level first word line WL1 and the lower-level second word line WL2 may be interconnected by the second word line pad WLP2. Each of the first word line WL1 and the second word line WL2 may include a high work function electrode HWG and a low work function electrode LWG, and one end of the high work function electrode HWG and one end of the low work function electrode may be interconnected in the contact portion CA.

FIG. 5B is a plan view of the upper-level double word line DWL. In the upper-level double word line DWL, the high work function electrodes HWG and the low work function electrodes LWG may be interconnected by the first word line pad WLP1. Similar to the upper-level double word line DWL, the high work function electrodes HWG and the low work function electrodes LWG of the lower-level double word line DWL may be interconnected by the second word line pad WLP2.

The semiconductor memory device 100 may further include a peripheral circuit unit PERI. The bit line BL of the memory cell array MCA may be oriented vertically along the first direction D1 with respect to the surface of the peripheral circuit unit PERI, and the double word line DWL may be oriented laterally along the third direction D3 with respect to the surface of the peripheral circuit unit PERI.

The peripheral circuit unit PERI may be disposed at a lower level than the memory cell array MCA. This may be referred to as a cell over PERI (COP) structure. The peripheral circuit unit PERI may include at least one control circuit for driving the memory cell array MCA. At least one control circuit of the peripheral circuit unit PERI may include an N-channel transistor, a P-channel transistor, a CMOS circuit, or a combination thereof. At least one control circuit of the peripheral circuit unit PERI may include an address decoder circuit, a read circuit, a write circuit, and the like. At least one control circuit of the peripheral circuit unit PERI may include a planar channel transistor, a recess channel transistor, a buried gate transistor, a fin channel transistor (FinFET), and the like.

For example, the peripheral circuit unit PERI may include sub word line drivers SWD1 and SWD2 and a sense amplifier SA. The upper-level double word line DWL may be connected to the first sub word line driver SWD1 through the first word line pads WLP1 and the first metal interconnections MI1. The lower-level double word line DWL may be connected to the second sub word line driver SWD2 through the second word line pads WLP2 and the second metal interconnections MI2. The bit lines BL may be connected to the sense amplifier SA through the third metal interconnections MI3. The third metal interconnection MI3 may have a multi-level metal structure including a plurality of vias and a plurality of metal lines.

Figure 6:
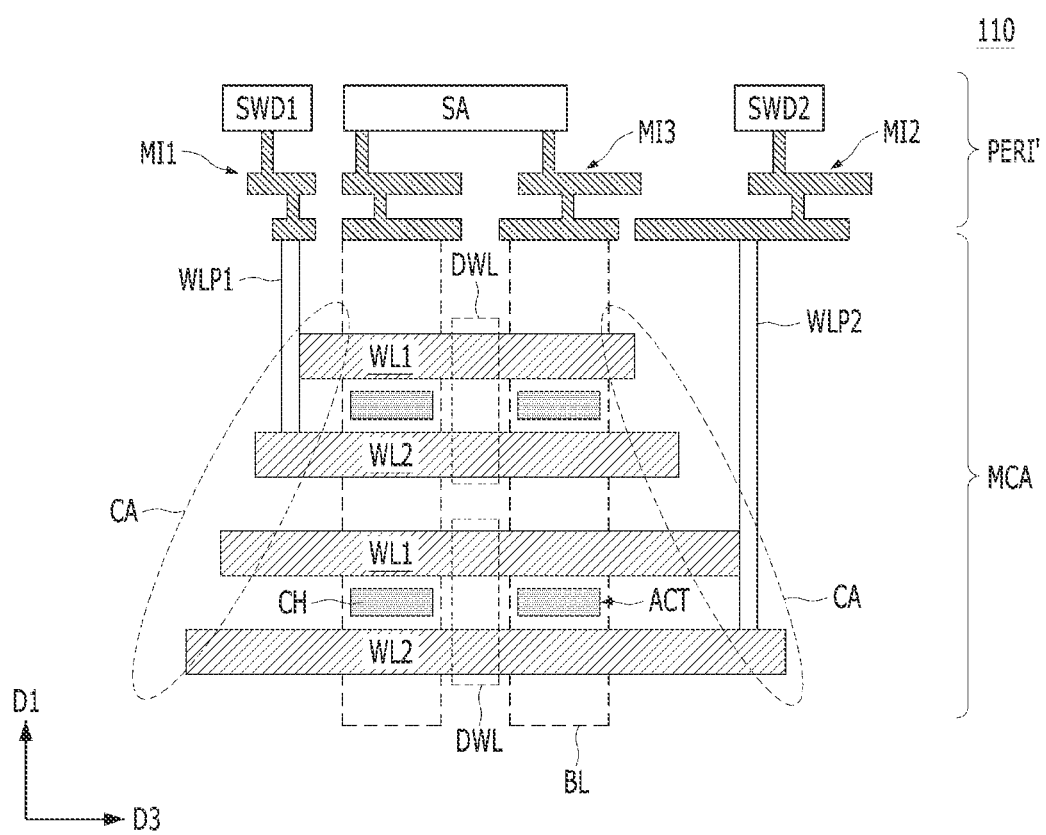
FIG. 6 is a diagram illustrating a semiconductor memory device according to another embodiment of the present invention, which is a variant of FIG. 5A.

FIG. 6 is a schematic cross-sectional view of a memory cell array of a semiconductor memory device according to another embodiment of the present invention. FIG. 6 illustrates a semiconductor memory device 110 having a POC structure. In FIG. 6, detailed descriptions of duplicate components as those of FIG. 5A will be omitted.

Referring to FIG. 6, the semiconductor memory device 110 may include a memory cell array MCA and a peripheral circuit unit PERI'. The peripheral circuit unit PERI' may be disposed at a higher level than the memory cell array MCA. This may be referred to as a POC (PERI over Cell) structure.

The peripheral circuit unit PERI' may include sub word line drivers SWD1 and SWD2 and a sense amplifier SA. The upper-level double word line DWL may be connected to the first sub word line driver SWD1 through the first word line pads WLP1 and the first metal interconnections MI1. The lower-level double word line DWL may be connected to the second sub word line driver SWD2 through the second word line pads WLP2 and the second metal interconnections MI2. The bit lines BL may be connected to the sense amplifier SA through the third metal interconnections MI3. The third metal interconnection MI3 may have a multi-level metal structure including a plurality of vias and a plurality of metal lines.

The memory cell array MCA may include a mirror-type structure sharing the bit line BL. The memory cell array MCA may include a mirror-type structure sharing the plate line PL.

FIGS. 7A to 7I are diagrams illustrating a method of fabricating a double word line according to an embodiment of the present invention.

Figure 7A:
FIGS. 7A to 7I are diagrams illustrating a method of fabricating a double word line according to an embodiment of the present invention.
Figure 7A:

As shown in FIG. 7A, a stack body SB may be formed on the substrate SUB. The stack body SB may include interlayer dielectric layers 11 and 15, sacrificial layers 12 and 14, and an active layer 13. The interlayer dielectric layers 11 and 15 may include a first interlayer dielectric layer 11 and a second interlayer dielectric layer 15. The sacrificial layers 12 and 14 may include a first sacrificial layer 12 and a second sacrificial layer 14. The active layer 13 may be disposed between the first interlayer dielectric layer 11 and the second interlayer dielectric layer 15. The first sacrificial layer 12 may be disposed between the first interlayer dielectric layer 11 and the active layer 13, and the second sacrificial layer 14 may be disposed between the second interlayer dielectric layer 15 and the active layer 13. The first and second interlayer dielectric layers 11 and 15 may include silicon oxide, and the first and second sacrificial layers 12 and 14 may include silicon nitride. The active layer 13 may include a semiconductor material or an oxide semiconductor material. The active layer 13 may include monocrystalline silicon, polysilicon, germanium, silicon-germanium, or IGZO.

Figure 7B:
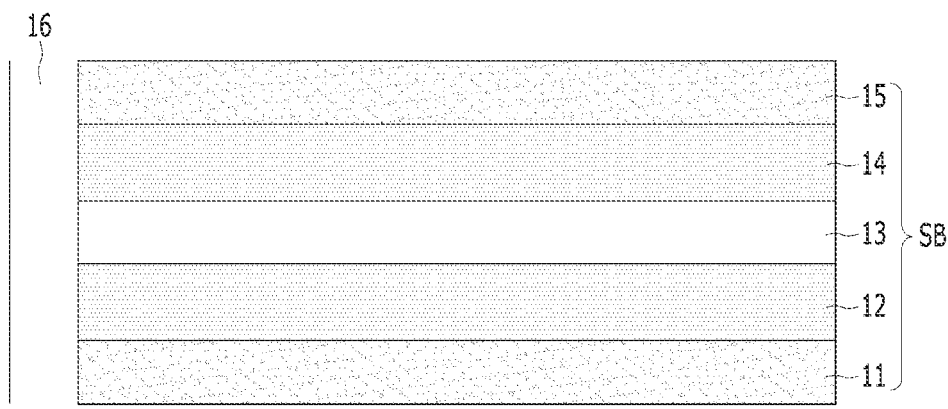
Figure 7B:

As shown in FIG. 7B, a first opening 16 may be formed by etching a first portion of the stack body SB. The first opening 16 may extend vertically. Although not shown, a plurality of active layers 13 may be formed between the first and second sacrificial layers 12 and 14. For example, similar to the active layer ACT shown in FIG. 3, a plurality of active layers 13 may be laterally arranged on the same plane. For example, forming the plurality of active layers 13 may include forming a stack body SB so that the first and second sacrificial layers 12 and 14 are disposed between the first and second interlayer dielectric layers 11 and 15 and a planar semiconductor layer is disposed between the first and second sacrificial layers 12 and 14, forming a plurality of device isolation holes by etching the stack body SB, forming a plurality of line-type semiconductor layers which are laterally disposed between the first and second sacrificial layers 12 and 14 by recess-etching the planar semiconductor layer through the device isolation holes.

Figure 7C:
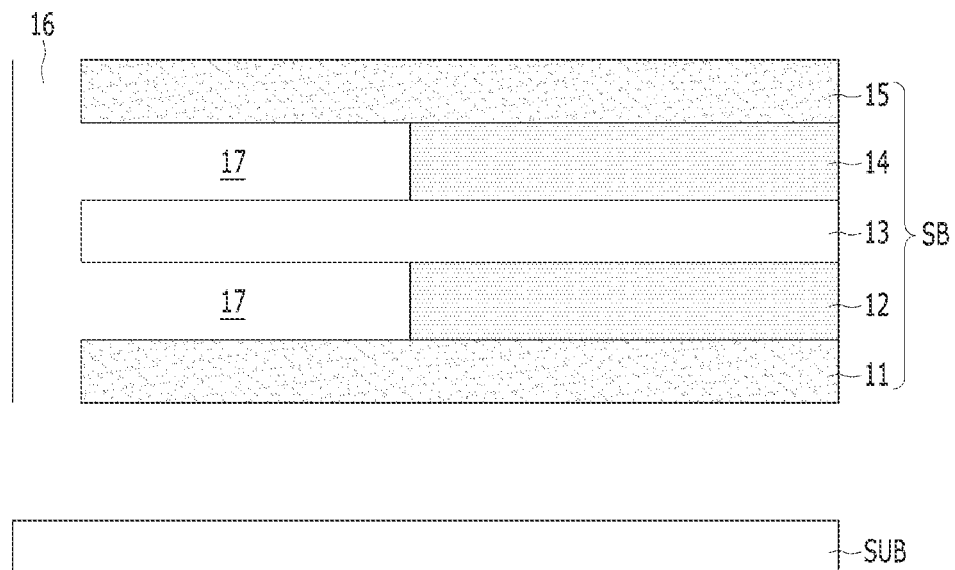

As shown in FIG. 7C, recesses 17 may be formed by selectively etching the first and second sacrificial layers 12 and 14 through the first opening 16. A portion of the active layer 13 may be exposed by the recesses 17.

Figure 7D:
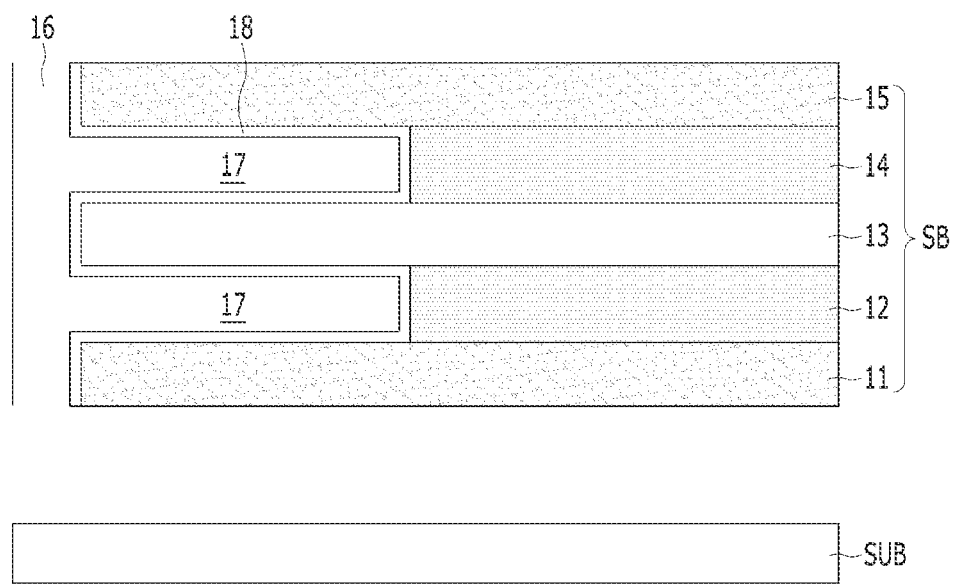

As shown in FIG. 7D, a gate dielectric layer 18 may be formed on the exposed portion of the active layer 13. The gate dielectric layer 18 may also be formed on the exposed portions of the first and second sacrificial layers 12, and 14, and on the exposed portions of the first and second interlayer dielectric layers 11 and 15. The gate dielectric layer 18 may be formed of silicon oxide, silicon nitride, metal oxide, metal oxynitride, metal silicate, a high-k material, a ferroelectric material, an anti-ferroelectric material, or a combination thereof. In another embodiment, the gate dielectric layer 18 may be formed by oxidizing the exposed portion of the active layer 13.

Figure 7E:
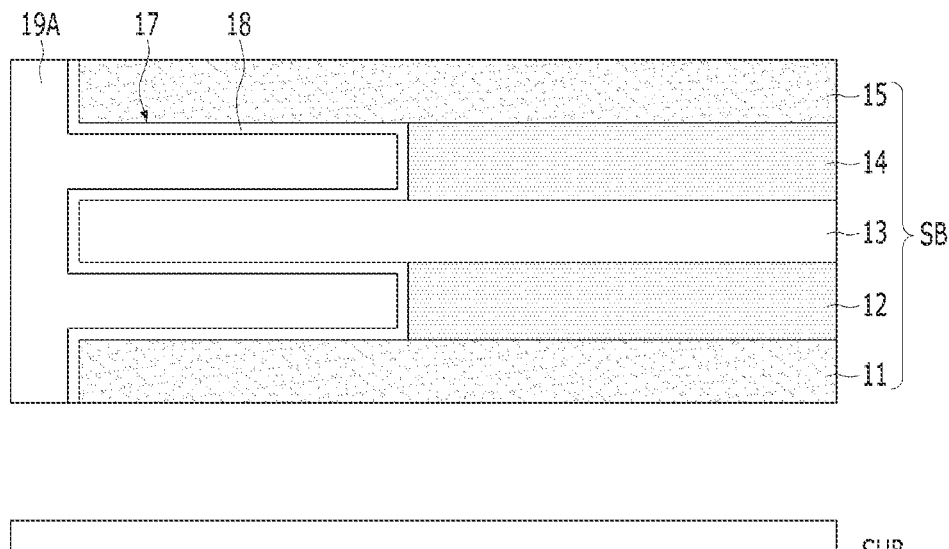

As shown in FIG. 7E, a low work function material 19A may be formed on the gate dielectric layer 18. The low work function material 19A may fill the first opening 16 and the recesses 17 over the gate dielectric layer 18. For example, the low work function material 19A may include polysilicon doped with N-type impurities.

Figure 7F:
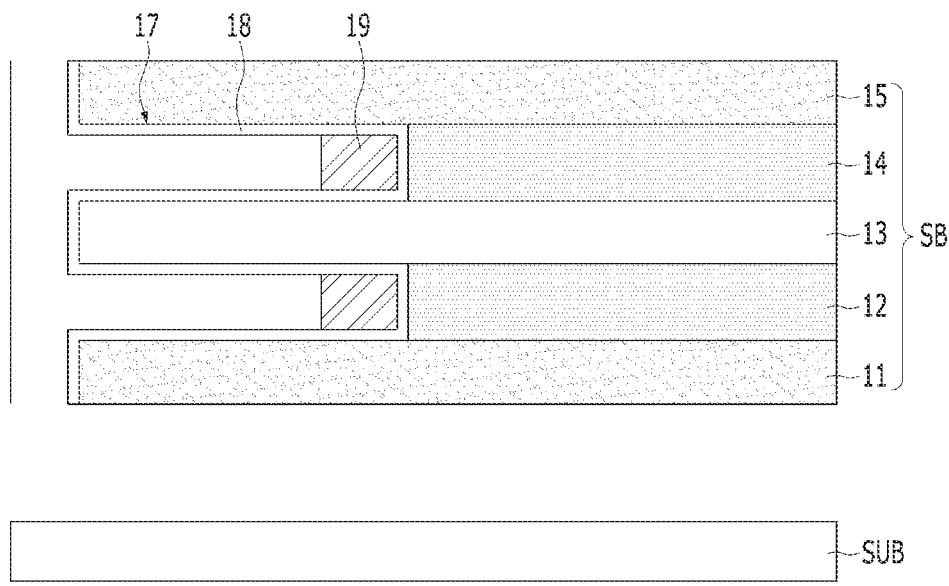

As shown in FIG. 7F, the low work function electrode 19 may be formed in the recesses 17. To form the low work function electrode 19, selective etching of the low work function material 19A may be performed. The selective etching of the low work function material 19A may include dry etching or wet etching. The selective etching of the low work function material 19A may be performed by blanket etching without a mask. The selective etching of the low work function material 19A may include an etch-back process.

For example, when the low work function material 19A includes doped polysilicon, an etch-back process of the doped polysilicon may be performed to form the low work function electrode 19.

After the low work function electrode 19 is formed, portions of the gate dielectric layer 18 may be exposed. The low work function electrodes 19 may partially fill the recesses 17.

Figure 7G:
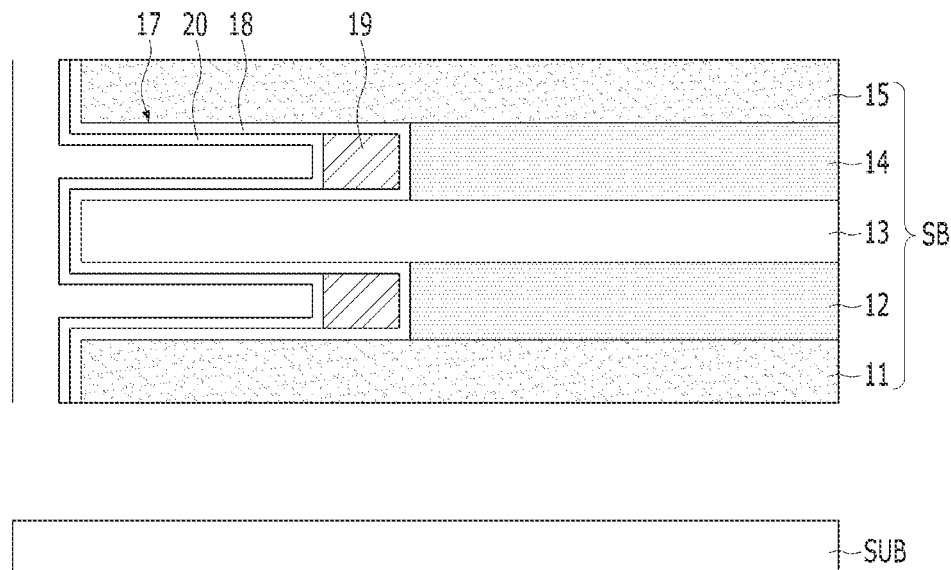

As shown in FIG. 7G, a dipole inducing layer 20 may be formed on the low work function electrodes 19 and the gate dielectric layer 18. The dipole inducing layer 20 may include a material having a higher oxygen content than the gate dielectric layer 18, that is, a material having a higher areal density of oxygen atoms. The dipole inducing layer 20 may include aluminum oxide ($Al_2O_3$) or hafnium oxide ($HfO_2$).

A low work function electrode 19 may be disposed between the gate dielectric layer 18 and the dipole inducing layer 20. The dipole inducing layer 20 may cover one side of the low work function electrode 19 and may be extended to cover exposed portions of the gate dielectric layer 18.

Figure 7H:
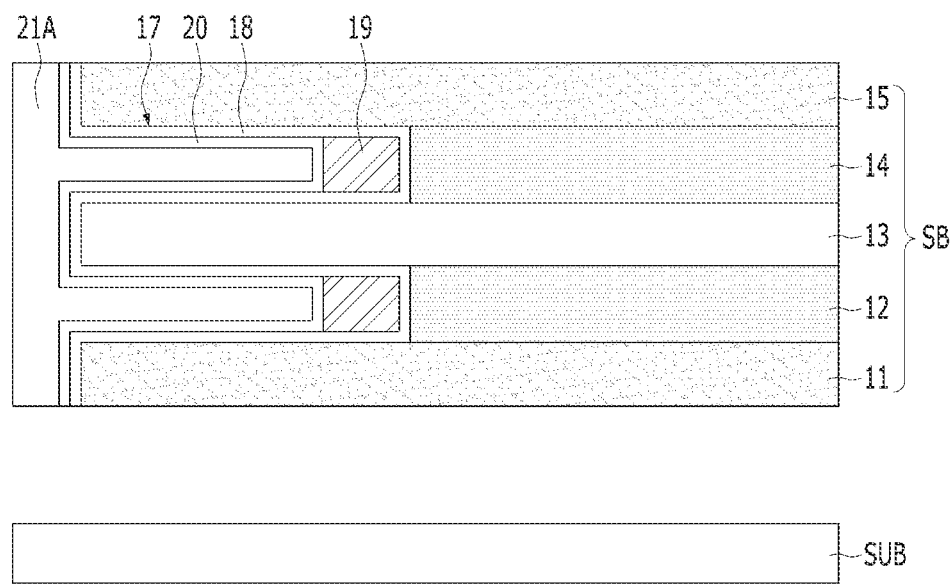

As shown in FIG. 7H, a high work function material 21A filling the remaining portions of the recesses 17 and the first opening 16 may be formed on the dipole inducing layer 20. The high work function material 21A may have a higher work function than the low work function electrode 19, and may have a lower resistivity than the low work function electrode 19. The high work function material 21A may include a metal-based material. For example, the high work function material 21A may include titanium nitride, tungsten, or a combination thereof. In this embodiment, the high work function material 21A may be formed of sequentially stacked titanium nitride and tungsten.

Figure 7I:
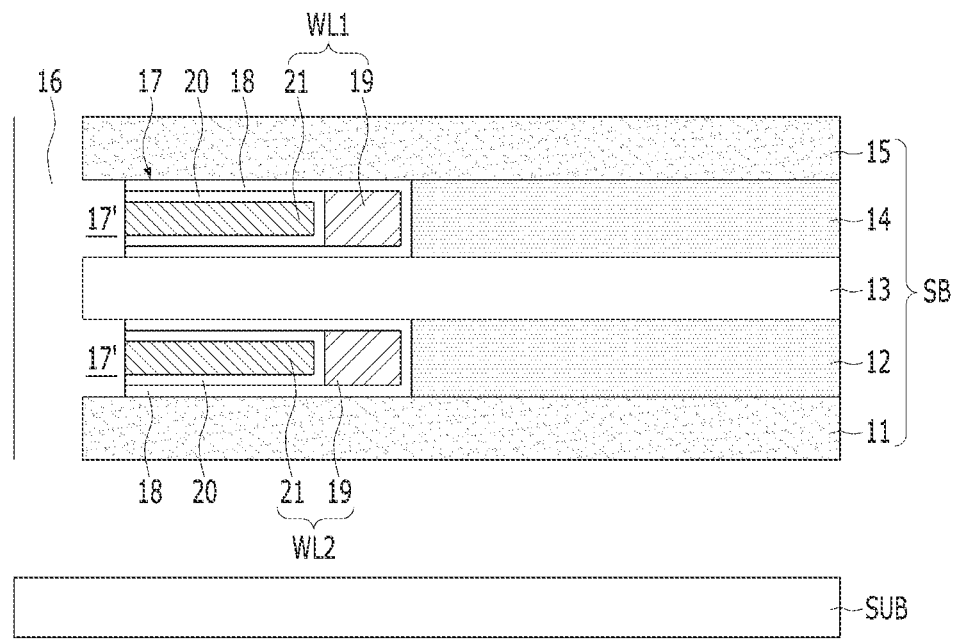

As shown in FIG. 7I, the high work function electrode 21 may be formed in each of the recesses 17. In order to form the high work function electrode 21, selective etching of the high work function material 21A may be performed. After the high work function electrode 21 is formed, portions of the gate dielectric layer 18 and the dipole inducing layer 20 may be etched. Accordingly, the gate dielectric layer 18 and the dipole inducing layer 20 may remain only in the recesses 17. The high work function electrode 21, the gate dielectric layer 18, and the dipole inducing layer 20 may be laterally recessed to be spaced apart from the first opening 16. For example, a gap 17' may be formed between the active layer 13 and the first interlayer dielectric layer 11. A gap 17' may also be formed between the active layer 13 and the second interlayer dielectric layer 15.

The high work function electrode 21 may be adjacent to one side of the low work function electrode 19 with the dipole inducing layer 20 interposed therebetween. The high work function electrode 21 may have a higher work function than the low work function electrode 19. The high work function electrode 21 may include a metal-based material. For example, the high work function electrode 21 may include titanium nitride, tungsten, or a combination thereof, and the low work function electrode 19 may include polysilicon doped with N-type impurities.

The gate dielectric layer 18 may be formed between the active layer 13 and the low work function electrode 19. The gate dielectric layer 18 and the dipole inducing layer 20 may be formed between the active layer 13 and the high work function electrode 21. A portion of the dipole inducing layer 20 may be disposed between the low work function electrode 19 and the high work function electrode 21.

A first word line WL1 and a second word line WL2 may be formed with the active layer 13 interposed therebetween. The first and second word lines WL1 and WL2 may correspond to the double word line DWL referenced in FIGS. 1 to 6. The first and second word lines WL1 and WL2 may be dual work function electrodes, each including a low work function electrode 19 and a high work function electrode 21. A gate dielectric layer 18 may be formed between the first word line WL1 and the active layer 13 and between the second word line WL2 and the active layer 13.

FIGS. 8A to 8G are diagrams illustrating methods of fabricating a bit line and a capacitor according to embodiments of the present invention.

Figure 8A:
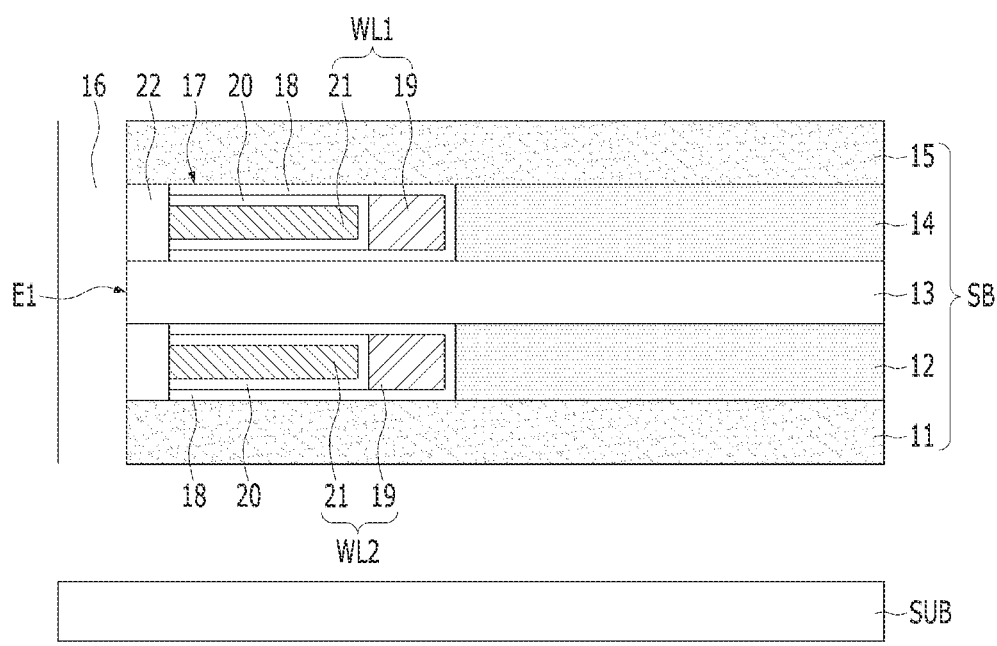
FIGS. 8A to 8G are diagrams illustrating a method of fabricating a bit line and a capacitor according to an embodiment of the present invention.

After the first and second word lines WL1 and WL2 are formed through the series of processes shown in FIGS. 7A to 7I, a protective layer 22 may be formed on a side of the high work function electrode 21 that is closer to the first opening 16 as shown in FIG. 8A. The protective layers 22 may include silicon oxide or silicon nitride. The protective layers 22 may be recessed where they only fill the gaps 17' in FIG. 7I. Thus, the protective layers 22 may not remain in the first opening 16, and the first end E1 of the active layer 13 may be exposed by the protective layers 22.

Figure 8B:
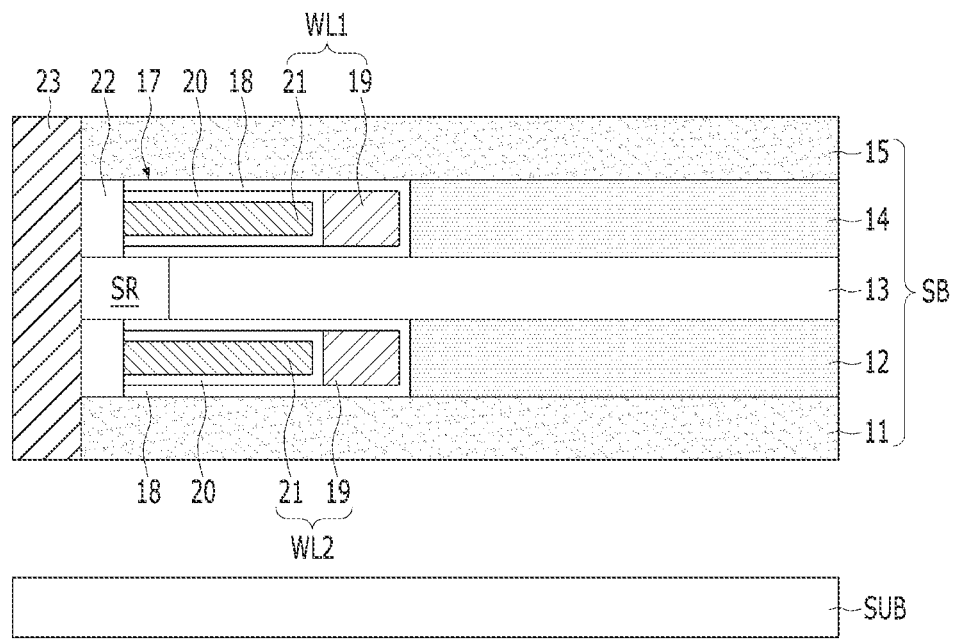

As shown in FIG. 8B, a first source/drain region SR may be formed at the first end E1 of the active layer 13. In order to form the first source/drain region SR, polysilicon containing impurities may be formed on the first opening 16, and then the impurities may be diffused from the polysilicon to the first end E1 of the active layer 13 by performing a subsequent heat treatment process. In another embodiment, the first source/drain regions SR may be formed by a doping process of impurities and a thermal treatment.

Next, the bit line 23 in contact with the first source/drain region SR may be formed. The bit line 23 may fill the first opening 16 and may extend vertically. The bit line 23 may include titanium nitride, tungsten, or a combination thereof. Although not shown, a bit line contact node and a bit line side-ohmic contact may be further formed between the bit line 23 and the first source/drain region SR. The bit line contact node may include polysilicon, and the bit line side-ohmic contact may include metal silicide.

Figure 8C:
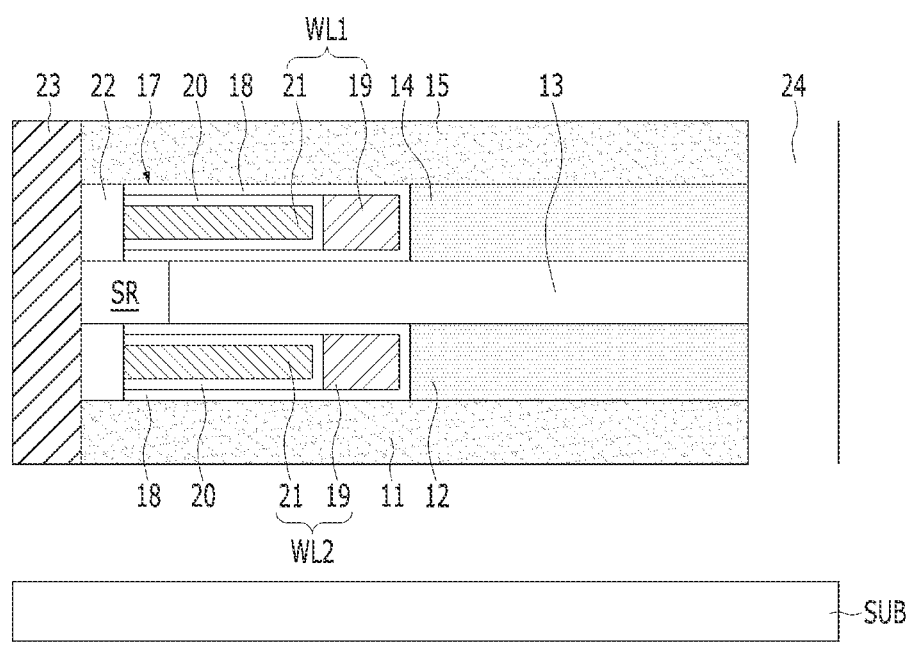

As shown in FIG. 8C, a second opening 24 may be formed by etching a second portion of the stack body SB. The second opening 24 may extend vertically.

Figure 8D:
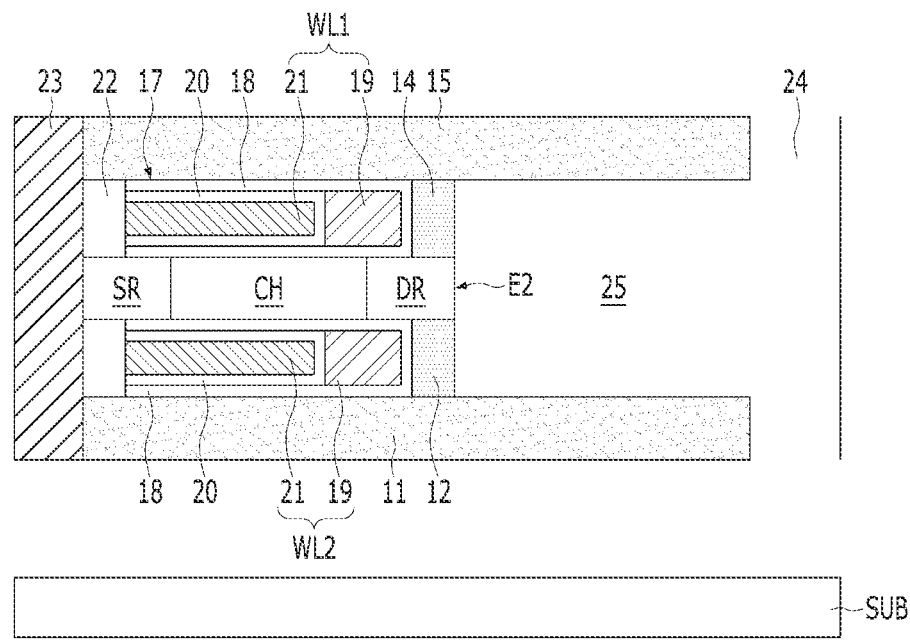

As shown in FIG. 8D, the first and second sacrificial layers 12 and 14 and the remaining active layer 13 may be selectively recessed through the second opening 24. Accordingly, a capacitor opening 25 may be formed between the first interlayer dielectric layer 11 and the second interlayer dielectric layer 15. The second end E2 of the active layer 13 may be exposed by the capacitor opening 25.

Next, a second source/drain region DR may be formed at the second end E2 of the active layer 13. To form the second source/drain regions DR, polysilicon containing impurities may be formed on the second opening 24 and the capacitor opening 25, and the impurities may be diffused from the polysilicon to the second end E2 of the active layer 13 by performing a subsequent heat treatment process. In another embodiment, the second source/drain region DR may be formed by a doping process of impurities and heat treatment. The first sacrificial layer 12 and the second sacrificial layer 14 may remain on the lower surface and the upper surface of the second source/drain region DR, respectively.

A channel CH may be defined between the first source/drain region SR and the second source/drain region DR. A double gate dielectric layer structure of a gate dielectric layer 18 and a dipole inducing layer 20 may be disposed between the channel CH and the high work function electrode 21. A double gate dielectric layer structure of a gate dielectric layer 18 and a dipole inducing layer 20 may be disposed between the first source/drain region SR and the high work function electrode 21. A single gate dielectric layer structure of the gate dielectric layer 18 may be disposed between the second source/drain region DR and the low work function electrode 19. A single gate dielectric layer structure of the gate dielectric layer 18 may be disposed between the channel CH and the second source/drain region DR.

Figure 8E:
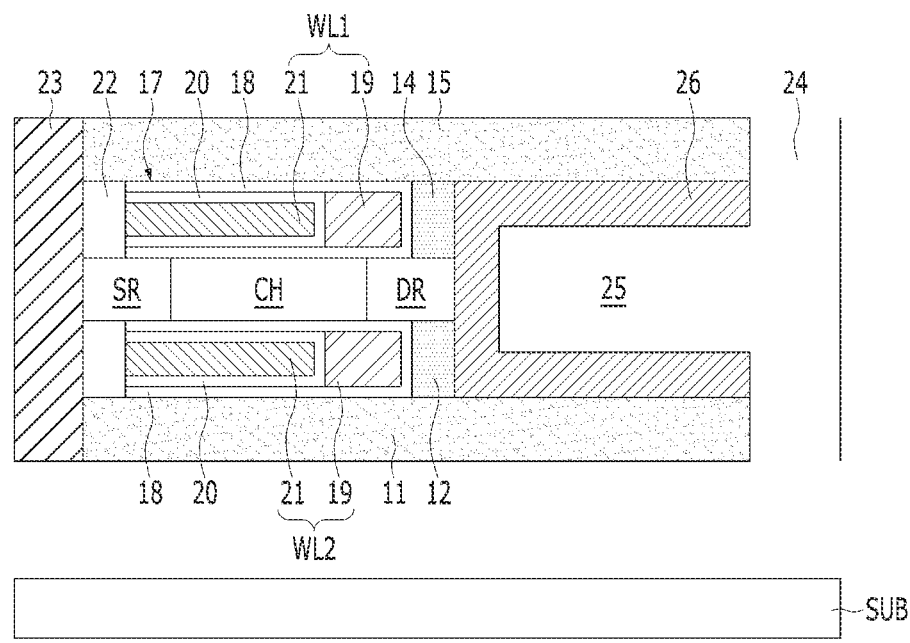

As shown in FIG. 8E, the storage node 26 in contact with the second source/drain region DR may be formed. To form the storage node 26, deposition and etch-back processes of a conductive material may be performed. The storage node 26 may include titanium nitride. The storage node 26 may have a laterally oriented cylindrical shape and may be disposed within the capacitor opening 25.

Figure 8F:
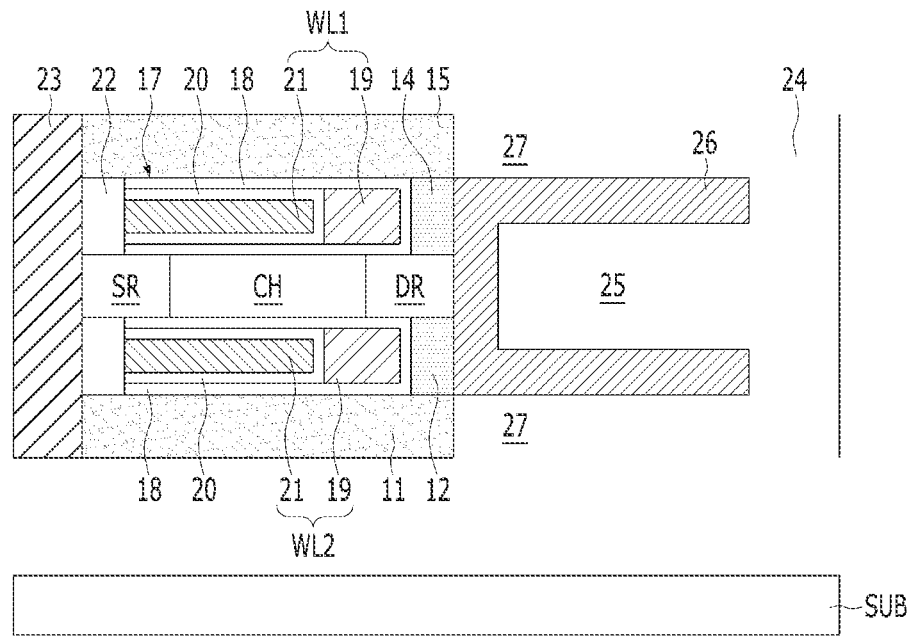

As shown in FIG. 8F, the outer wall of the storage node 26 may be exposed by recessing the first and second interlayer dielectric layers 11 and 15 (refer to reference numeral 27).

Figure 8G:
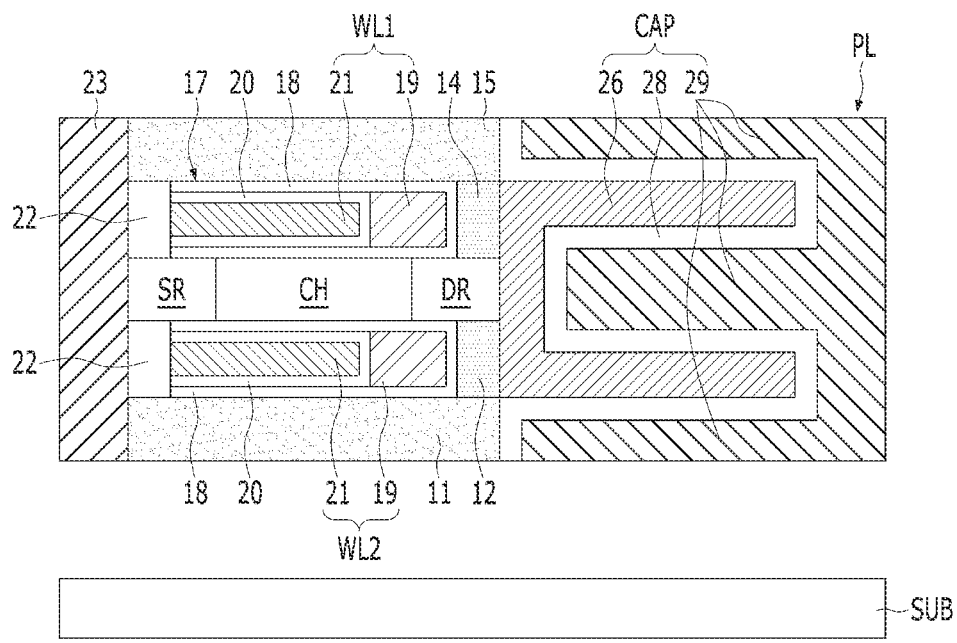

As shown in FIG. 8G, the dielectric layer 28 and the plate node 29 may be sequentially formed on the storage node 26. The capacitor CAP may include the storage node 26, the dielectric layer 28, and the plate node 29. The plate node 29 may be connected to the plate line PL.

Figure 9:
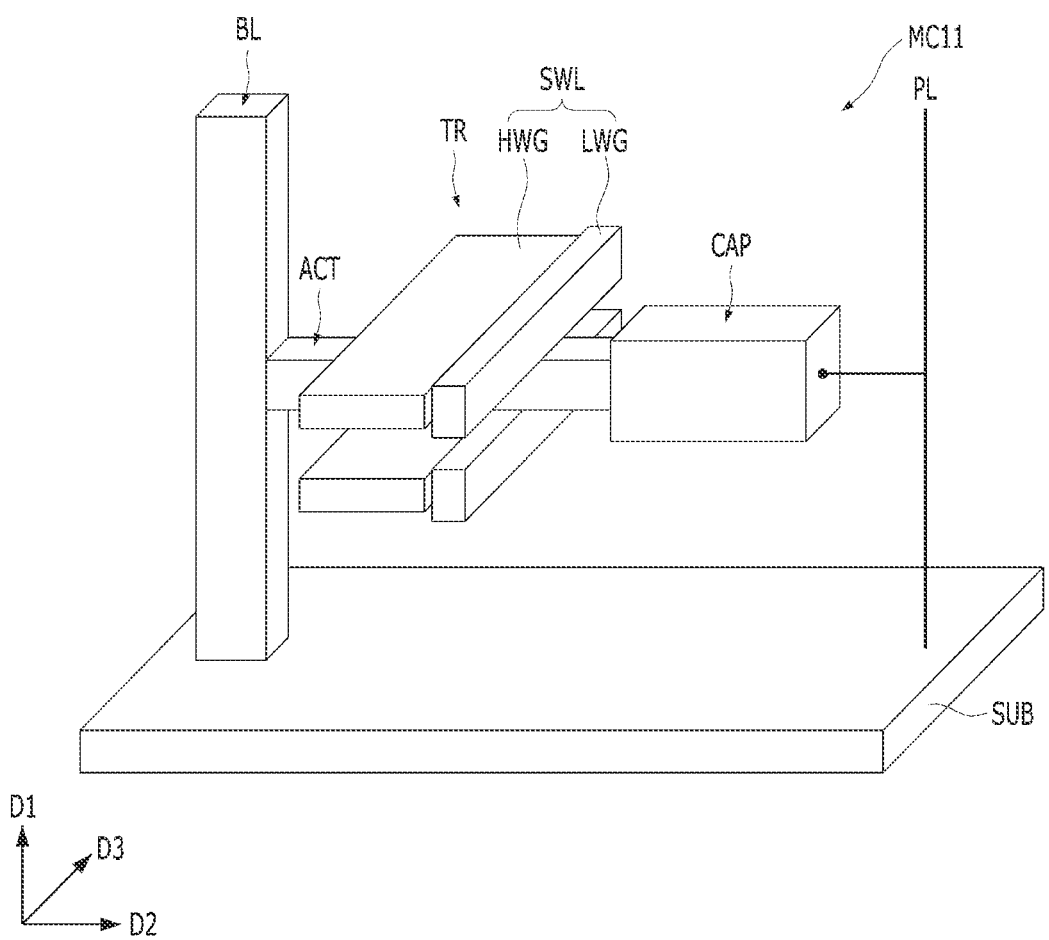
FIGS. 9 and 10 are schematic perspective views of memory cells according to other embodiments of the present invention.

FIG. 9 is a schematic perspective view of a memory cell according to another embodiment. The components of the memory cell MC11 of FIG. 9 except for the single word line SWL may be similar to those of the memory cell MC of FIGS. 1 and 2.

Referring to FIG. 9, the memory cell MC11 may include a bit line BL, a transistor TR, and a capacitor CAP. The transistor TR may include an active layer ACT and a single word line SWL. The single word line SWL may be formed on one of the upper and lower surfaces of the active layer ACT. The single word line SWL may include a low work function electrode LWG and a high work function electrode HWG. The low work function electrode LWG may be disposed adjacent to the capacitor CAP, and the high work function electrode HWG may be disposed adjacent to the bit line BL. The low work function electrode LWG and the high work function electrode HWG may not directly contact each other.

Although not shown, the memory cell MC11 may further include a gate dielectric layer and a dipole inducing layer. The gate dielectric layer and the dipole inducing layer of the memory cell MC11 will be illustrated with reference to FIG. 2. Referring back to FIGS. 2 and 9, the gate dielectric layer GD may be formed between the active layer ACT and the low work function electrode LWG. The gate dielectric layer GD and the dipole inducing layer DP may be formed between the active layer ACT and the high work function electrode HWG. A portion of the dipole inducing layer DP may be disposed between the low work function electrode LWG and the high work function electrode HWG.

As another embodiment, the plurality of memory cells MC11 may constitute a memory cell array as shown in FIG. 3.

Figure 10:
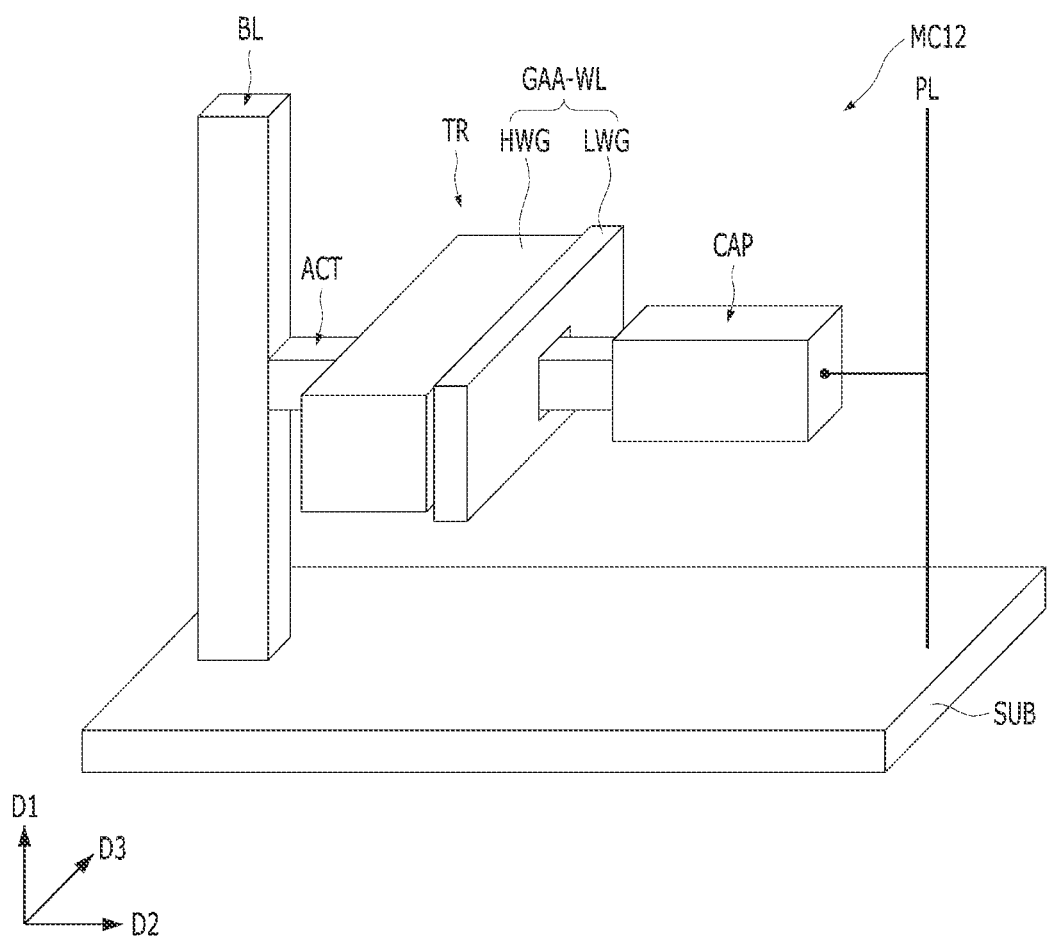

FIG. 10 is a schematic perspective view of a memory cell according to another embodiment. The components of the memory cell MC12 of FIG. 10 may be similar to those of the memory cell MC of FIGS. 1 and 2 except for a gate all-around word lines GAA-WL.

Referring to FIG. 10, the memory cell MC12 of the 3D semiconductor memory device may include a bit line BL, a transistor TR, and a capacitor CAP. The transistor TR may include an active layer ACT and a gate all-around word line GAA-WL. The gate all-around word line GAA-WL may extend along the third direction D3 while surrounding a portion (i.e., the channel) of the active layer ACT. The active layer ACT may have a shape penetrating the gate all-around word line GAA-WL. The gate all-around word line GAA-WL may include a low work function electrode LWG and a high work function electrode HWG. The low work function electrode LWG may be disposed adjacent to the capacitor CAP. The high work function electrode HWG may be disposed adjacent to the bit line BL. The low work function electrode LWG and the high work function electrode HWG may not directly contact each other.

Although not shown, the memory cell MC12 may further include a gate dielectric layer and a dipole inducing layer. The gate dielectric layer and the dipole inducing layer of the memory cell MC12 will be illustrated with reference to FIG. 2. Referring back to FIGS. 2 and 10, the gate dielectric layer GD may be formed between the active layer ACT and the low work function electrode LWG. The gate dielectric layer GD and the dipole inducing layer DP may be formed between the active layer ACT and the high work function electrode HWG. A portion of the dipole inducing layer DP may be disposed between the low work function electrode LWG and the high work function electrode HWG.

As another embodiment, the plurality of memory cells MC12 may constitute a memory cell array as shown in FIG. 3.

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A semiconductor device comprising:
   an active layer including a channel, the active layer being spaced apart from a substrate and extending in a direction parallel to a surface of the substrate;
   a gate dielectric layer formed over the active layer;
   a word line laterally oriented in a direction crossing the active layer over the gate dielectric layer and including a low work function electrode and a high work function electrode, the high work function electrode having a higher work function than the low work function electrode; and
   a dipole inducing layer disposed between the high work function electrode and the gate dielectric layer.

2. The semiconductor device of claim 1,
   wherein the dipole inducing layer is disposed between the high work function electrode and the low work function electrode, and
   wherein the dipole inducing layer extends to cover upper and lower surfaces of the high work function electrode.

3. The semiconductor device of claim 1, wherein the dipole inducing layer includes a material having a higher areal density of oxygen atoms than the gate dielectric layer.

4. The semiconductor device of claim 1, wherein the dipole inducing layer includes aluminum oxide ($Al_2O_3$) or hafnium oxide ($HfO_2$).

5. The semiconductor device of claim 1, wherein the low work function electrode and the high work function electrode extend in parallel to each other in a direction crossing the active layer.

6. The semiconductor device of claim 1, wherein the low work function electrode includes polysilicon doped with an N-type impurity.

7. The semiconductor device of claim 1, wherein the high work function electrode includes a metal-based material.

8. The semiconductor device of claim 1, wherein the high work function electrode includes titanium nitride, tungsten, or a stack of titanium nitride and tungsten.

9. The semiconductor device of claim 1, wherein the active layer includes a semiconductor material or an oxide semiconductor material.

10. The semiconductor device of claim 1, wherein the active layer includes polysilicon, monocrystalline silicon, germanium, silicon-germanium, or Indium Gallium Zinc Oxide (IGZO).

11. The semiconductor device of claim 1, wherein the gate dielectric layer includes silicon oxide, silicon nitride, metal oxide, metal oxynitride, metal silicate, a high-k material, a ferroelectric material, an anti-ferroelectric material, or a combination thereof.

12. The semiconductor device of claim 1,
wherein the active layer further includes a first source/drain region and a second source/drain region disposed on both sides of the channel, respectively,
wherein the first source/drain region neighbors the high work function electrode, and
wherein the second source/drain region neighbors the low work function electrode.

13. The semiconductor device of claim 12, further including:
a bit line being in contact with the first source/drain region and extending vertically to the surface of the substrate; and
a capacitor including a storage node, the storage node being connected to the second source/drain region,
wherein the bit line neighbors the high work function electrode, and the storage node neighbors the low work function electrode.

14. The semiconductor device of claim 1, wherein the word line includes a double word line, single word line, or a gate all-around word line.

15. The semiconductor device of claim 1, wherein the gate dielectric layer has a shape covering the dipole inducing layer and the low work function electrode.

* * * * *